United States Patent
You et al.

(10) Patent No.: US 11,121,251 B2
(45) Date of Patent: *Sep. 14, 2021

(54) LATERALLY DIFFUSED METAL OXIDE SEMICONDUCTOR DEVICE AND METHOD FOR MANUFACTURING THE SAME

(71) Applicant: Silergy Semiconductor Technology (Hangzhou) LTD, Hangzhou (CN)

(72) Inventors: Budong You, Hangzhou (CN); Hui Yu, Hangzhou (CN); Meng Wang, Hangzhou (CN); Yicheng Du, Hangzhou (CN); Chuan Peng, Hangzhou (CN); Xianguo Huang, Hangzhou (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/412,587

(22) Filed: May 15, 2019

(65) Prior Publication Data
US 2019/0363185 A1 Nov. 28, 2019

(30) Foreign Application Priority Data
May 25, 2018 (CN) .......................... 201810515185.8

(51) Int. Cl.
| | |
|---|---|
| *H01L 29/78* | (2006.01) |
| *H01L 29/06* | (2006.01) |
| *H01L 29/10* | (2006.01) |
| *H01L 29/66* | (2006.01) |

(52) U.S. Cl.
CPC ........ *H01L 29/7816* (2013.01); *H01L 29/063* (2013.01); *H01L 29/0649* (2013.01); *H01L 29/1095* (2013.01); *H01L 29/66681* (2013.01)

(58) Field of Classification Search
CPC ........... H01L 29/7816; H01L 29/66681; H01L 29/063; H01L 29/0623; H01L 29/404; H01L 29/402
See application file for complete search history.

(56) References Cited

U.S. PATENT DOCUMENTS

| | | | |
|---|---|---|---|
| 7,018,899 B2 * | 3/2006 | Sung ................. | H01L 29/66704 438/270 |
| 7,074,659 B2 | 7/2006 | Zuniga et al. | |
| 7,230,302 B2 * | 6/2007 | Lotfi .................... | H01L 21/761 257/369 |
| 7,888,222 B2 | 2/2011 | You et al. | |

(Continued)

*Primary Examiner* — Khaja Ahmad
*Assistant Examiner* — Khatib A Rahman
(74) *Attorney, Agent, or Firm* — Michael C. Stephens, Jr.

(57) ABSTRACT

A laterally diffused metal oxide semiconductor device can include: a base layer; a source region and a drain region located in the base layer; a first dielectric layer located on a top surface of the base layer and adjacent to the source region; a voltage withstanding layer located on the top surface of the base layer and located between the first dielectric layer and the drain region; a first conductor at least partially located on the first dielectric layer; a second conductor at least partially located on the voltage withstanding layer; and a source electrode electrically connected to the source region, where the first and second conductors are spatially isolated, and the source electrode at least covers a space between the first and second conductors.

7 Claims, 8 Drawing Sheets

(56) References Cited

U.S. PATENT DOCUMENTS

| | | | |
|---|---|---|---|
| 7,981,739 B1 * | 7/2011 | You | H01L 29/7801 438/204 |
| 7,999,318 B2 | 8/2011 | Zuniga et al. | |
| 8,063,444 B2 * | 11/2011 | Chang | H01L 29/0878 257/343 |
| 8,119,507 B2 * | 2/2012 | You | H01L 29/66689 438/527 |
| 8,173,510 B2 * | 5/2012 | Denison | H01L 29/407 438/270 |
| 8,293,612 B2 | 10/2012 | Lee | |
| 8,319,283 B2 * | 11/2012 | Min | H01L 29/0619 257/343 |
| 8,431,450 B1 * | 4/2013 | Zuniga | H01L 29/0634 438/163 |
| 8,455,340 B2 | 6/2013 | Zuniga et al. | |
| 8,574,973 B1 | 11/2013 | You et al. | |
| 8,581,344 B2 * | 11/2013 | Liu | H01L 29/0692 257/343 |
| 8,716,790 B2 | 5/2014 | Lotfi et al. | |
| 8,716,795 B2 * | 5/2014 | You | H01L 29/7835 257/343 |
| 8,912,600 B2 | 12/2014 | You | |
| 2010/0052052 A1 | 3/2010 | Lotfi et al. | |
| 2013/0020632 A1 * | 1/2013 | Disney | H01L 29/66659 257/328 |
| 2014/0320174 A1 | 10/2014 | Lu et al. | |
| 2015/0380398 A1 * | 12/2015 | Mallikarjunaswamy | H01L 29/0878 257/272 |
| 2017/0263766 A1 * | 9/2017 | Xia | H01L 21/31111 |
| 2018/0190814 A1 * | 7/2018 | Pendharkar | H01L 29/4238 |
| 2019/0165167 A1 * | 5/2019 | Lin | H01L 29/0882 |
| 2019/0267455 A1 * | 8/2019 | Lin | H01L 29/1083 |
| 2019/0371902 A1 * | 12/2019 | Castro | H01L 29/063 |

* cited by examiner

LATERALLY DIFFUSED METAL OXIDE SEMICONDUCTOR DEVICE AND METHOD FOR MANUFACTURING THE SAME

RELATED APPLICATIONS

This application claims the benefit of Chinese Patent Application No. 201810515185.8, filed on May 25, 2018, which is incorporated herein by reference in its entirety.

FIELD OF THE INVENTION

The present invention generally relates to semiconductor devices, and more particularly to laterally diffused metal oxide semiconductor devices and associated methods.

BACKGROUND

Voltage regulators, such as DC-to-DC voltage converters, are used to provide stable voltage sources for various electronic systems. Efficient DC-to-DC converters are particularly useful for battery management in low power devices (e.g., laptop notebooks, cellular phones, etc.). A switching voltage regulator can generate an output voltage by converting an input DC voltage into a high frequency voltage, and then filtering the high frequency input voltage to generate the output DC voltage. For example, the switching regulator can include a switch for alternately coupling and decoupling an input DC voltage source (e.g., a battery) to a load (e.g., an integrated circuit [IC], a light-emitting diode [LED], etc.). An output filter, can include an inductor and a capacitor, and may be coupled between the input voltage source and the load to filter the output of the switch, and thus provide the output DC voltage. A controller (e.g., a pulse-width modulator, a pulse frequency modulator, etc.) can control the switch to maintain a substantially constant output DC voltage. Lateral double-diffused metal oxide semiconductor (LDMOS) transistors may be utilized in switching regulators due to their performance in terms of a tradeoff between their specific on-resistance ($R_{dson}$) and drain-to-source breakdown voltage ($BV_{d\_s}$).

DETAILED DESCRIPTION

Figure 1:
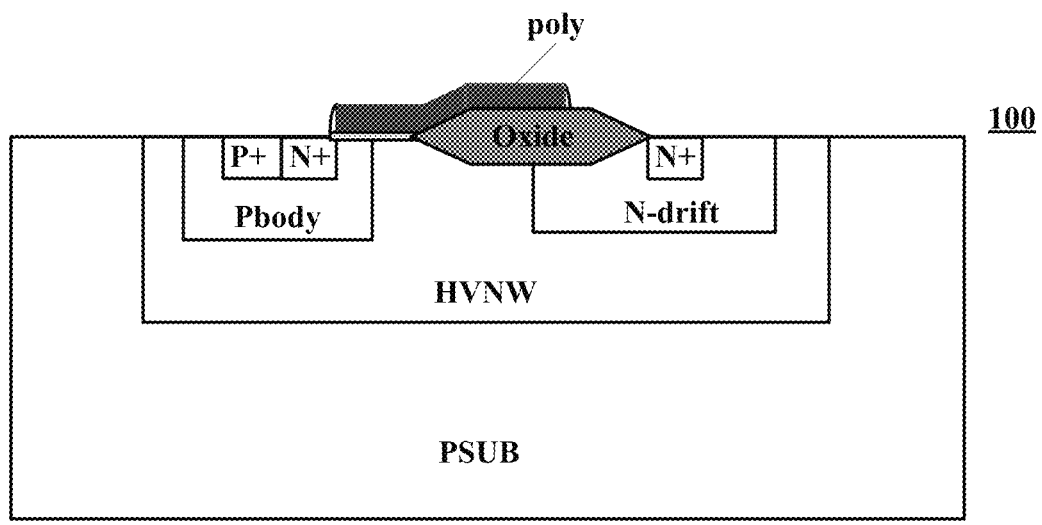
FIG. 1 is a cross-sectional view of an example laterally diffused metal oxide semiconductor device.

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

Semiconductor devices are generally manufactured using two complex manufacturing processes: front-end manufacturing and back-end manufacturing. Front-end manufacturing may involve the formation of a plurality of die on the surface of a semiconductor wafer. Each die on the wafer may contain active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components can be formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist may be removed, leaving behind a patterned layer. Alternatively, some types of materials can be patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface may be used to produce smaller and more densely packed active and passive components. Planarization can be used to remove material from the surface of the wafer and produce a uniformly flat surface. Planarization can involve polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer may be singulated using a laser cutting tool or saw blade. After singulation, the individual die are mounted to a package substrate that includes pins or contact pads for interconnection with other system components. Contact pads formed over the semiconductor die can then be connected to contact pads within the package. The electrical connections can be made with solder bumps, stud bumps, conductive paste, or wire bonds, as a few examples. An encapsulant or other molding material may be deposited over the package to provide physical support and electrical isolation. The finished package can then be inserted into an electrical system and the functionality of the semiconductor device is made available to the other system components.

Referring now to FIG. 1, shown is a cross-sectional view of an example laterally diffused metal oxide semiconductor device. In this particular example, semiconductor device 100 can include P-type substrate PSUB, high voltage N-type well region HVNW in P-type substrate PSUB, and P-type body region Pbody and N-type drift region N-drift in high voltage N-type well region HVNW. A source region N+ and a drain region N+ can respectively be formed in P-type body region Pbody and N-type drift region N-drift. A body contact region P+ may also be formed in the P-type body region Pbody and be arranged in contact with the source region N+. A gate dielectric layer can be arranged on a surface of semiconductor device 100 and adjacent to the source region. Thick oxide layer Oxide between the gate dielectric layer and the drain region can be arranged on the surface of semiconductor device 100. A gate conductor poly can cover the gate dielectric layer and extends to the thick oxide layer Oxide.

In semiconductor device 100, gate conductor may extend from the gate dielectric layer to thick oxide layer Oxide, and the entire conductor layer Poly can act as a gate conductor, which can receive a control voltage controlling the turn-on/off of semiconductor device 100 through the gate electrode. Therefore, when semiconductor device 100 is in the off state, the potential on thick oxide layer Oxide may not assist in depleting the N-type drift region N-drift, and the high-voltage breakdown performance of the device may not be maintained. Further, the gate electrode can extend above the N-type drift region N-drift, and the overlap between the gate region and the drain region may be relatively large, such that the gate charge Qgd is relatively large, and the high frequency application of semiconductor device 100 is accordingly limited.

In one embodiment, a laterally diffused metal oxide semiconductor device can include: (i) a base layer; (ii) a source region and a drain region located in the base layer; (iii) a first dielectric layer located on a top surface of the base layer and adjacent to the source region; (iv) a voltage withstanding layer located on the top surface of the base layer and located between the first dielectric layer and the drain region; (v) a first conductor at least partially located on the first dielectric layer; (vi) a second conductor at least partially located on the voltage withstanding layer; and (vii) a source electrode electrically connected to the source region, where the first and second conductors are spatially isolated, and the source electrode at least covers a space between the first and second conductors.

Figure 2:
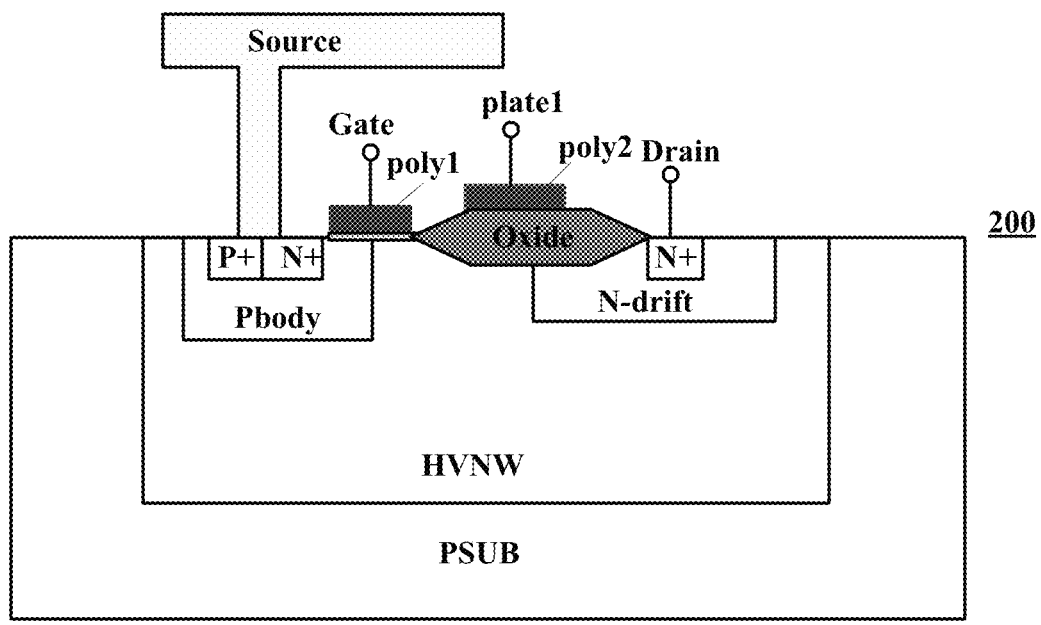
FIG. 2 is a cross-sectional view of a first example laterally diffused metal oxide semiconductor device, in accordance with embodiments of the present invention.

Referring now to FIG. 2, shown is a cross-sectional view of a first example laterally diffused metal oxide semiconductor device, in accordance with embodiments of the present invention. Semiconductor device 200 can include a base layer, a source region, a drain region, a first dielectric layer, and a voltage withstanding layer. The source region and the drain region can be located in the base layer, the first dielectric layer may be located on the top surface of the base layer and adjacent to the source region, and the voltage withstanding layer can be located on the top surface of the base layer and between the first dielectric layer and the drain region. Semiconductor device 200 can also include a first conductor on the first dielectric layer, a second conductor on the voltage withstanding layer, and a source electrode electrically connected to the source region. The first and second conductors can be spatially isolated, and the source electrode may cover at least a space between the first and second conductors. The spatial isolation is that the first and second conductors are not in contact with each other in space, and are separated from each other.

In semiconductor device 200, the source region and the drain region are both N-type doped N+ regions. In other examples, the source region and the drain region may be P-type doped P+ regions. The base layer can include a P-type doped substrate PSUB and an N-type high voltage well region HVNW located in the P-type substrate PSUB. In other examples, the base layer may be composed only of a semiconductor substrate. The first dielectric layer may serve as a gate dielectric layer, and the first conductor can be a gate conductor for electrically connecting the gate electrode Gate. The first dielectric layer may be an oxide layer (e.g., a SiO2 layer), and the first conductor may be a polysilicon layer Poly1 covering the first dielectric layer. The voltage withstanding layer may be a local oxidation of silicon (LOCOS) dielectric layer (e.g., thick oxide layer Oxide), and thick oxide layer Oxide may be a bird's beak shape, where the thickness of the voltage withstanding layer is greater than the thickness of the first dielectric layer. The second conductor may be polysilicon Poly2 on the voltage withstanding layer.

The second conductor can be electrically connected to field plate electrode Plate1. Field plate electrode Plate1 can connect to the same potential as source electrode Source. That is, field plate electrode Plate1 may be electrically connected to source electrode Source, or field plate electrode Plate1 may be connected to other potentials separately, and field plate electrode Plate1 can connect to different potential from gate electrode Gate. Since field plate electrode Plate1 and gate electrode Gate are connected to different potentials, when the potential connected to gate electrode Gate causes semiconductor device 200 to be in an off state, field plate electrode Plate1 can still assist in depleting the drift region by receiving a certain potential, in order to maintain the high voltage withstanding of semiconductor device 200. In addition, since the first conductor is fully located on the first dielectric layer, such that an overlapping portion between the first conductor and the drain portion (e.g., a region where the drain region is located) becomes relatively small, gate charge Qgd can be greatly reduced, such that semiconductor device 200 can be suitable in a high frequency field.

Source electrode Source can electrically be connected to the source region and may extend at least to above the second conductor (e.g., polysilicon Poly2) such that the first dielectric layer and/or thick oxide layer Oxide located between the first and second conductors are covered by the source electrode. That is, the space between the first and second conductors can be covered by the source electrode Source, which may not mean that source electrode Source is directly in contact with first dielectric layer and/or the voltage-withstanding layer, but rather is non-contact covering (e.g., source electrode Source is located above the first dielectric layer and/or the voltage-withstanding layer). The electric field at the disconnected position of the first and second conductors may drop, and in semiconductor device 200, the disconnected position can be covered by source electrode Source without contact to avoid the dropping phenomenon, thereby improving the voltage withstanding performance of semiconductor device 200.

Semiconductor device 200 can also include an interlayer dielectric layer on the top surface of the base layer, where the source region N+ is exposed by the interlayer dielectric layer. Source electrode Source can include a first portion that is in contact with the source region N+ through the interlayer dielectric layer, and a second portion that is on a surface of the interlayer dielectric layer and extends at least to above the second conductor. The second portion can be electrically connected to the first portion, and may extend from the first portion to above the second conductor. A portion of source electrode Source can be located above where the first and second conductors are disconnected.

Semiconductor device 200 can also include a drift region and a body region in the base layer. The drain region can be located in the drift region, and at least a portion of the withstand voltage layer may be located on the drift region. The source region can be located in the body region, and at least a portion of the first dielectric layer may be located on the body region. The doping type of the body region can be different from the doping type of the source region. For example, an N-type source region can be located in a P-type doped body region Pbody and may be electrically connected to source electrode Source (shown in FIG. 2 by a connection terminal). The drift region and the drain region may have the same doping type. For example, a doping concentration of an N-type drift region N-drift may be less than that of drain region N+, and drain region N+ can be electrically connected to drain electrode Drain (shown in FIG. 2 by a connection terminal). Body region Pbody may serve as a channel region of semiconductor device 200, and at least a portion of the first dielectric layer can cover the surface of body region Pbody. A portion of drift region N-drift may be located under voltage withstanding layer Oxide, and drift region N-drift can extend as far as possible to body region Pbody in order to hinder lateral diffusion of body region Pbody toward the drain region.

Figure 3:
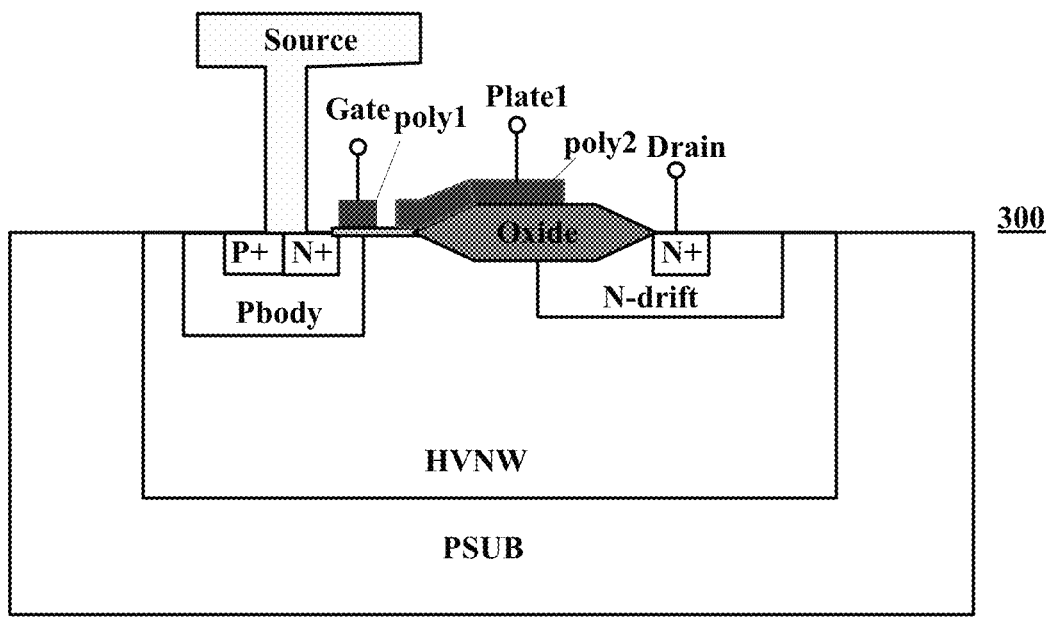
FIG. 3 is a cross-sectional view of a second example laterally diffused metal oxide semiconductor device, in accordance with embodiments of the present invention.

Referring now to FIG. 3, shown is a cross-sectional view of a second example laterally diffused metal oxide semiconductor device, in accordance with embodiments of the present invention. One difference between semiconductor devices 300 and 200 involves the second conductor. In semiconductor device 300, polysilicon Poly2 may not only be located on thick oxide layer Oxide, but also can be located on the first dielectric layer. For example, polysilicon Poly2 can extend from the surface of the first dielectric layer to the surface of voltage withstanding layer Oxide, such that polysilicon Poly2 covers the juncture region between the first dielectric layer and voltage withstanding layer Oxide, in order to effectively reduce gate charge Qgd of semiconductor device.

Figure 4:
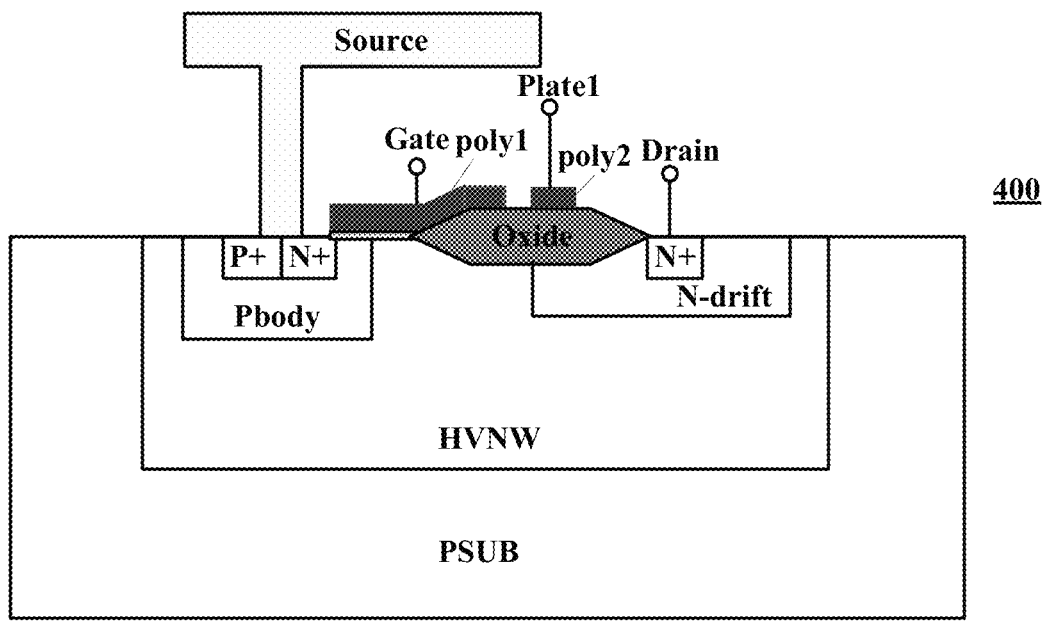
FIG. 4 is a cross-sectional view of a third example laterally diffused metal oxide semiconductor device, in accordance with embodiments of the present invention.

Referring now to FIG. 4, shown is a cross-sectional view of a third example laterally diffused metal oxide semiconductor device, in accordance with embodiments of the present invention. One difference between semiconductor devices 400 and 200 involves the first conductor. In semiconductor device 400, polysilicon Poly1 may not only be located on the first dielectric layer, but also can be located on thick oxide layer Oxide. For example, polysilicon Poly1 may extend from the first dielectric layer to thick oxide layer Oxide, such that polysilicon Poly1 covers the juncture region between the first dielectric layer and voltage withstanding layer Oxide, in order to effectively reduce gate charge Qgd of semiconductor device.

Figure 5:
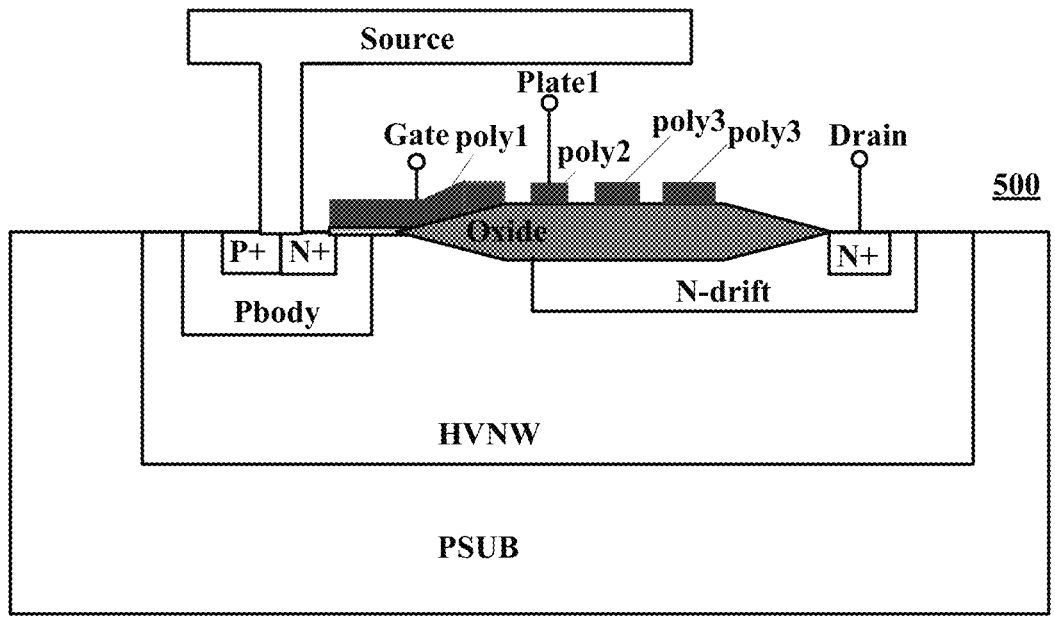
FIG. 5 is a cross-sectional view of a fourth example laterally diffused metal oxide semiconductor device, in accordance with embodiments of the present invention.

Referring now to FIG. 5, shown is a cross-sectional view of a fourth example laterally diffused metal oxide semiconductor device, in accordance with embodiments of the present invention. Semiconductor device 500 may differ from semiconductor device 400 in including at least one third conductor. The third conductor(s) can be located on voltage withstanding layer Oxide, may be spatially isolated from each other, and the third conductor adjacent to the second conductor can be spatially isolated from the second conductor. In semiconductor device 500, the third conductor layer may be polysilicon Poly3, and each of polysilicon Poly3 can be electrically connected to corresponding one of the second field plate electrodes. Also, the potential of each of the second field plate electrodes may be different from that of first field plate Plate1. The closer the polysilicon Poly3 is to the drain region N+, the higher potential of a second field plate electrically connected to polysilicon Poly3 is, and the voltage withstanding performance of the device can be further improved. In addition, a resistor may be disposed between second field plate electrode adjacent to first field plate electrode, and first field plate electrode Plate1 and/or the resistor may be disposed between the adjacent second field plate electrodes. For example, the source electrode may further cover a space between the second and third conductors and a space between the third conductor(s).

Figure 6:
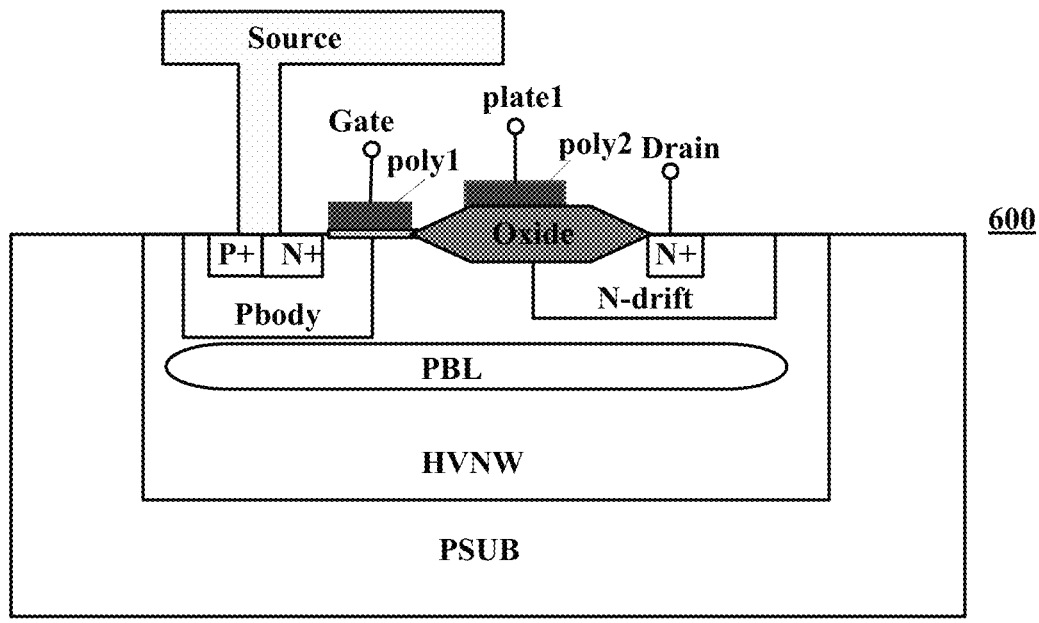
FIG. 6 is a cross-sectional view of a fifth example laterally diffused metal oxide semiconductor device, in accordance with embodiments of the present invention.

Referring now to FIG. 6, shown is a cross-sectional view of a fifth example laterally diffused metal oxide semiconductor device, in accordance with embodiments of the present invention. Semiconductor device 600 is similar to semiconductor device 200, but also can include a reduced surface field effect layer in the base layer, and a lower surface of the body region and a lower surface of the drift region may not be lower than an upper surface of the reduced surface field effect layer. For example, the reduced surface field effect layer can be located below the body region and the drift region, and the doping type of the reduced surface field effect layer may be the same as that of the body region and different from that of the drift region.

The reduced surface field effect layer can assist in depleting the drift region such that when the drift region has a higher doping concentration, it can still be quickly depleted to reduce the surface electric field of semiconductor device 600. Thus, semiconductor device 600 may have both low on-resistance (Rdson) and a high breakdown voltage (BV). In order to further reduce on-resistance Rdson of semiconductor device 600, the first spacing distance between the upper of the reduced surface field effect layer and the lower surface of the drift region may be set to be greater than zero. That is, there can be a certain space between the reduced surface field effect layer and the drift region to supply electrons to flow through. In addition, in order to better adjust the voltage withstanding characteristic of semiconductor device 600, the first spacing distance can be adjusted according to the doping concentration of the drift region. For example, the larger the doping concentration of the drift region is, the more the auxiliary depletion of the reduced surface field effect layer is needed and the smaller the first spacing distance is, and vice versa.

In semiconductor device 600, the reduced surface field effect layer may be a P-type buried layer PBL formed in N-type high voltage well region HVNW. In order to provide sufficient dopant of the first type (e.g., the first doping type is P-type, and the dopant of first type is P-type dopant) at a position closer to the surface of semiconductor device 600, the second spacing distance between the upper surface of the reduced surface field effect layer and the lower surface of the body region may be set to less than or equal to the first spacing distance, in order to better assist in deplete the region near the drain region to reduce the surface electric field of the region. In semiconductor device 600, the lower surface of the body region may be closer to the upper surface of the reduced surface field effect layer than the lower surface of the drift region, body region Pbody can be P-type, and N-type source region N+ may be located in body region Pbody. Also, the source region can be electrically connected to source electrode Source (shown as a connection terminal is illustrated in FIG. 2).

In semiconductor device 600, the reduced surface field effect layer can be a P-type buried layer PBL. In order to ensure that the first spacing distance is greater than or equal to the second spacing distance, in a first direction, the junction depth of the drift region may be less than the junction depth of the body region, where the first direction refers to a stacking direction of the reduced surface field effect layer and the drift region. The reduced surface field effect layer in semiconductor device 600 can also be employed in semiconductor devices 300, 400, and/or 500.

Figure 7:
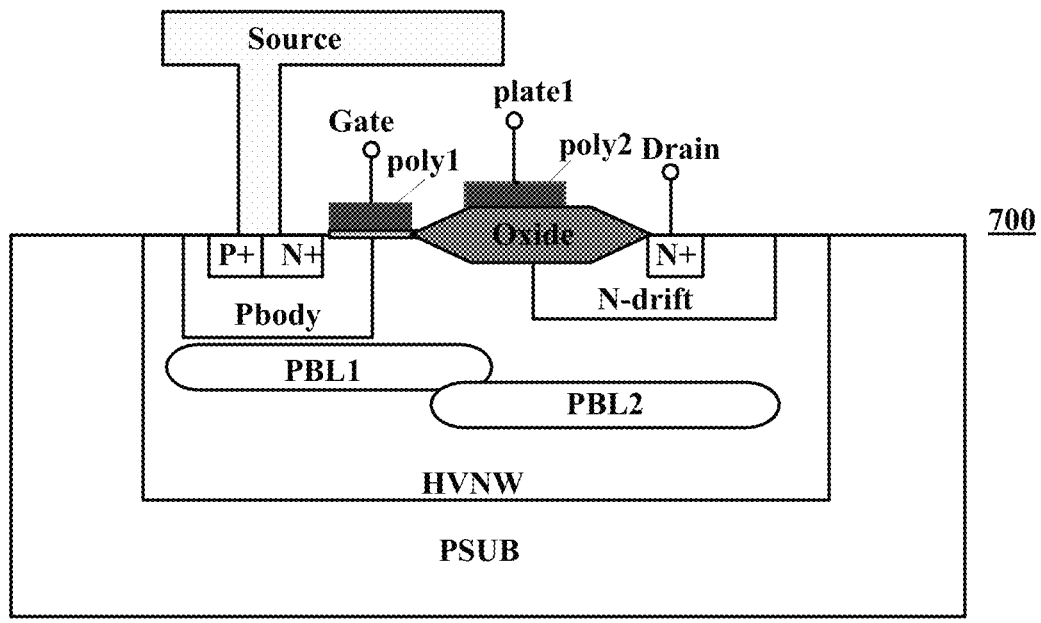
FIG. 7 is a cross-sectional view of a sixth example laterally diffused metal oxide semiconductor device, in accordance with embodiments of the present invention.

Referring now to FIG. 7, shown is a cross-sectional view of a sixth example laterally diffused metal oxide semiconductor device, in accordance with embodiments of the present invention. In semiconductor device 700, the spacing distance between the upper surface of the reduced surface field effect layer (the side close to the drift region) and the top surface of the base layer may not be constant value. For example, the third spacing distance between the upper surface of the reduced surface field effect layer located below the body region and the top surface of the base layer may be less than a fourth spacing between the upper surface of the reduced surface field effect layer located below the drift region and the top surface of the base layer. The reduced surface field effect layer located below the body region may be as close as possible to the body region to reduce the surface electric field, and can improve the breakdown voltage of semiconductor device 700. There can be a space between the upper surface of the reduced surface field effect layer and the lower surface of the drift region, in order to reduce on-resistance of semiconductor device 700 by the greatest extent.

In semiconductor device 700, the reduced surface field effect layer may be composed of first and second buried layers located in the base layer, and the first and second buried layers may be in contact with each other. At least a portion of the first buried layer can be located below the body region, and at least a portion of the second buried layer can be located below the drift region. A spacing distance between the upper surface of the first buried layer and the top surface of the base layer is a third spacing distance, and a spacing distance between the upper surface of the second buried layer and the top surface of the base layer is a fourth spacing distance. The first buried layer can be a P-type buried layer PBL1, and the second buried layer may be a P-type buried layer PBL2. Buried layer PBL1 can be disposed as close as possible to P-type body region Pbody. For example, buried layer PBL1 and P-type body region Pbody can be in direct contact. A voltage of the source electrode applied to body region Pbody e.g. the reference ground voltage) may also be applied to PBL1 through the body region to avoid dynamic Rdson from occurring. Buried layer PBL2 may not be in contact with drift region N-drift. That is, the first spacing distance can be greater than zero, in order to provide a wider current path for the electrons, and to further reduce the Rdson of semiconductor device 700. The reduced surface field effect layer in semiconductor device 700 can also be employed in semiconductor devices 300, e 400, and/or 500.

Figure 8:
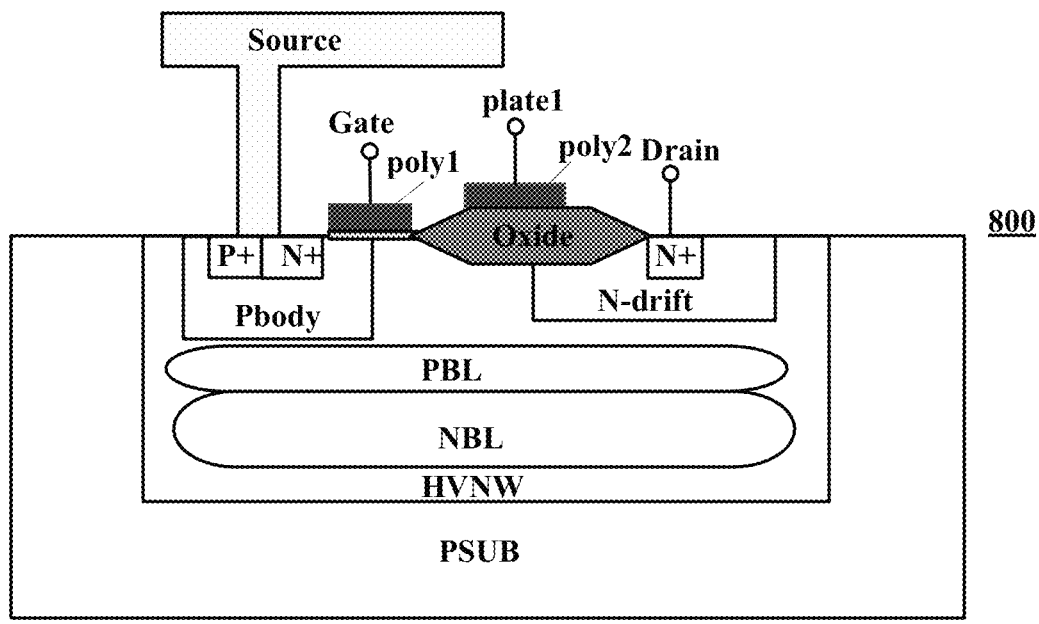
FIG. 8 is a cross-sectional view of a seventh example laterally diffused metal oxide semiconductor device, in accordance with embodiments of the present invention.

Referring now to FIG. 8, shown is a cross-sectional view of a seventh example laterally diffused metal oxide semiconductor device, in accordance with embodiments of the present invention. In semiconductor device 800, an isolation layer can be located in the base layer and below the reduced surface field effect layer. The isolation layer may isolate the reduced surface field effect layer from the bottom portion of the base layer to facilitate high voltage application of semiconductor device 800. In this particular example, the isolation layer may be third buried layer NBL of the N-type doped located in high voltage well HVNW and can be located below buried layer PBL. Also, the doping concentration of the third buried layer NBL may be heavier than that of the high voltage well HVNW. Similarly, the isolation layer described in semiconductor device 800 may be employed and disposed below the reduced surface field effect layer in semiconductor device 700.

In particular embodiments, a method of manufacturing a laterally diffused metal oxide semiconductor device, can include forming a source region and a drain region in a base layer, and forming a first dielectric layer on a top surface of the base layer, where the first dielectric layer is adjacent to the source region. The method can also include forming a voltage withstanding layer between the first dielectric layer and the drain region, forming a conductor layer on the first dielectric layer and the voltage withstanding layer, and forming a first conductor at least partially located on the first dielectric layer and a second conductor at least partially located on voltage withstanding layer by etching the conductor layer. The first and second conductors can be spatially isolated. The method can also include forming a source electrode electrically connected to the source region, where the source electrode at least covers a space between the first and second conductors. Before forming the source electrode, an interlayer dielectric layer can be formed on the top surface of the base layer. The source region may be exposed by the interlayer dielectric layer. The source electrode can include a first portion in contact with the source region through the interlayer dielectric layer, and a second portion located on a surface of the interlayer dielectric layer and extending at least to above the second conductor.

In particular embodiments, a semiconductor device can be formed according to the example manufacturing method, as shown in FIGS. 2-8. High voltage well region HVNW can be formed in semiconductor substrate PSUB, and base layer can include high voltage well region HVNW and semiconductor substrate PSUB. A field oxide layer may then be formed using a local oxidation of silicon (LOCOS) process. Voltage withstanding layer Oxide can be formed using the LOCOS process after limiting the high-voltage drain region with a mask, and the drift region and the reduced surface field effect layer can be formed.

Further, after forming the reduced surface field effect layer, the method can also include forming an isolation layer (e.g., an NBL layer) in the base layer. The isolation layer can be located below the reduced surface the field effect layer in order to isolate the reduced surface field effect layer from the bottom portion of the base layer. In particular embodiments, a method of manufacturing a semiconductor device can also include forming a first dielectric layer as shown in FIGS. 2-8. That is, a gate dielectric layer, and then a conductor layer (e.g., a polysilicon layer) may be deposited on the first dielectric layer and voltage withstanding layer Oxide, and the deposited conductor layer may be etched to form the first, second, and third conductors, as shown in FIGS. 2-8.

The first dielectric layer may be adjacent to the source region. After forming the first and second conductors, the method can include forming a body region (e.g., a P-type body region), as shown in each of FIGS. 2-8. A lightly doped drain (LDD) region (e.g., an n-type lightly doped [NLDD] region) can be formed in the body region (e.g., Pbody) and the drift region by an ion implanting process. The second spacing distance between the body region and the reduced surface field effect layer may be less than or equal to the first spacing distance. After forming the body region and the lightly doped region, sidewalls spacers can also be formed at the side surfaces of the first, second, and/or third conductors, that are shown in FIGS. 2-8. In addition, a source region and a drain region may respectively be formed in the body region and the drift region. Further, a source electrode, a drain electrode, a gate electrode, and field plate electrodes can also formed, where the source electrode may extend at least to above the second conductor.

In addition, when forming the reduced surface field effect layer, the first spacing distance may be adjusted according to the doping concentration of the drift region. For example, the higher the doping concentration of the drift region, the smaller the first spacing distance. A reduced surface field effect layer having two P-type buried layers (see, e.g., FIG. 3) may also be formed by using two masks. A third spacing distance between the upper surface of the reduced surface field effect layer located below the body region and the top surface of the base layer can be less than a fourth spacing distance between the upper surface of the reduced surface field effect layer located below the drift region and the top surface of the base layer.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A laterally diffused metal oxide semiconductor device, the semiconductor device comprising:
   a) a base layer;
   b) a source region and a drain region located in the base layer;
   c) a first dielectric layer located on a top surface of the base layer and adjacent to the source region;
   d) a voltage withstanding layer located on the top surface of the base layer and located between the first dielectric layer and the drain region;
   e) a first conductor at least partially located on the first dielectric layer;
   f) a second conductor at least partially located on the voltage withstanding layer;
   g) a plurality of third conductors located on the voltage withstanding layer; and
   h) a source electrode electrically connected to the source region,
   i) wherein the first and second conductors are spatially isolated, and the source electrode covers a space between the first and second conductors, between the second conductor and the plurality of third conductors, and between an adjacent pair of the plurality of third conductors.

2. The semiconductor device according to claim 1, further comprising an interlayer dielectric layer on the top surface of the base layer, wherein the source region is exposed by the interlayer dielectric layer, and the source electrode comprises a first portion in contact with the source region through the interlayer dielectric layer, and a second portion located on a surface of the interlayer dielectric layer and extending at least to above the second conductor.

3. The semiconductor device according to claim 1, further comprising a gate electrode electrically connected to the first conductor and a first field plate electrode electrically connected to the second conductor, wherein the first field plate electrode and the gate electrode are coupled to different potentials, and wherein the first field plate electrode and the source electrode are coupled to the same potential.

4. The semiconductor device according to claim 1, wherein each of the plurality of third conductors is spatially isolated from each other, and one of the plurality of third conductors that is adjacent to the second conductor is spatially isolated from the second conductor.

5. The semiconductor device according to claim 4, further comprising a plurality of second field plate electrodes that are each electrically connected to a corresponding one of the plurality of third conductors, wherein a potential of a second field plate electrode that is closer to the drain region is higher than a potential of a second field plate electrode that is farther from the drain region.

6. The semiconductor device according to claim 1, wherein a juncture region between the first dielectric layer and the voltage withstanding layer is covered by one of the second conductor and the first conductor.

7. The semiconductor device according to claim 1, further comprising a drift region and a body region located in the base layer, wherein the drain region is located in the drift region, and at least a portion of the voltage withstanding layer is located on the drift region, the source region is located in the body region, and at least a portion of the first dielectric layer is located on the body region.

* * * * *